(12) United States Patent
Kim et al.

(10) Patent No.: US 9,180,483 B2
(45) Date of Patent: Nov. 10, 2015

(54) INTEGRATED COATING SYSTEM

(71) Applicant: KOREA INSTITUTE OF MACHINERY & MATERIALS, Daejeon (KR)

(72) Inventors: In Young Kim, Daejeon (KR); Taik Min Lee, Daejeon (KR); Seung-Hyun Lee, Daejeon (KR); Dong Woo Kang, Daejeon (KR); Kwang-Young Kim, Daejeon (KR); Young Man Choi, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 64 days.

(21) Appl. No.: 14/010,717

(22) Filed: Aug. 27, 2013

(65) Prior Publication Data

US 2014/0076233 A1 Mar. 20, 2014

(30) Foreign Application Priority Data

Sep. 19, 2012 (KR) .................. 10-2012-0103657

(51) Int. Cl.
*B05C 13/00* (2006.01)
*B05C 1/08* (2006.01)
(Continued)

(52) U.S. Cl.
CPC .............. *B05C 13/00* (2013.01); *B05C 1/086* (2013.01); *B05C 1/0813* (2013.01); *G03F 7/16* (2013.01);
(Continued)

(58) Field of Classification Search
CPC .... B05C 1/0813; B05C 1/086; B05C 1/0808; B05C 13/00; B05C 5/0254; H01L 21/6715; H01L 21/67115; H01L 21/67173; H01L 21/67721; G03F 7/16; B41F 23/08; B41F 23/00; B41J 11/002; B41J 11/007; B41J 13/223
USPC ......... 118/46, 66–68, 641–643, 58, 211, 217, 118/224, 232, 235, 261, 304, DIG. 4; 101/148, 423, 424.1, 424.2; 347/2, 347/102, 104
See application file for complete search history.

(56) References Cited

U.S. PATENT DOCUMENTS 4,280,693 A * 7/1981 Matsuhisa et al. ............ 271/246
7,012,746 B2 3/2006 Bermel
(Continued)

FOREIGN PATENT DOCUMENTS

JP 05-104049 4/1993
JP 3015463 6/1995
(Continued)

OTHER PUBLICATIONS http://www.coatema.de/eng/lab_solutions/modular_coating.php?navanchor=1310034, Coatena, Coating Machinery GmbH, Lab Solutions, Modular Coating.

*Primary Examiner* — Laura Edwards
(74) *Attorney, Agent, or Firm* — Lex IP Meister, PLLC

(57) ABSTRACT

Provided is an integrated coating system. An integrated coating system according to an exemplary embodiment of the present invention includes: a unwinding means provided with a roll to supply a web; a worktable roll configured to support the web supplied from the unwinding means; a plurality of printing means configured to perform printing or coating on the web supplied from the unwinding means; a plurality of curing means each of which is modulated to cure a printing material on the web passing through at least one printing means; and a winding means around which the web, of which printing or coating work is completed by passing through the curing means, is wound in a roll shape.

18 Claims, 5 Drawing Sheets

(51) Int. Cl.
*H01L 21/67* (2006.01)
*H01L 21/677* (2006.01)
*G03F 7/16* (2006.01)
*B41F 23/08* (2006.01)
*B41J 13/22* (2006.01)
*B41J 11/00* (2006.01)
*B41F 23/00* (2006.01)
*B05C 5/02* (2006.01)

(52) U.S. Cl.
CPC ...... *H01L 21/6715* (2013.01); *H01L 21/67115* (2013.01); *H01L 21/67173* (2013.01); *H01L 21/67721* (2013.01); *B05C 5/0254* (2013.01); *B41F 23/00* (2013.01); *B41F 23/08* (2013.01); *B41J 11/002* (2013.01); *B41J 11/007* (2013.01); *B41J 13/223* (2013.01)

(56) References Cited

U.S. PATENT DOCUMENTS

| | | | |
|---|---|---|---|
| 7,048,823 | B2 | 5/2006 | Bermel |
| 7,083,752 | B2 | 8/2006 | Bermel |
| 7,163,738 | B2 | 1/2007 | Bermel |
| 7,393,579 | B2 | 7/2008 | Bermel |
| RE41,048 | E * | 12/2009 | Davis et al. .................. 101/141 |
| 7,686,987 | B2 | 3/2010 | Bermel |
| 2002/0168212 | A1* | 11/2002 | Nedblake et al. ............. 400/621 |
| 2005/0193906 | A1* | 9/2005 | Nakamura et al. ........... 101/211 |
| 2006/0127608 | A1 | 6/2006 | Bermel |
| 2007/0024684 | A1 | 2/2007 | Konno |
| 2009/0317555 | A1* | 12/2009 | Hori ......................... 427/428.06 |
| 2010/0089264 | A1* | 4/2010 | Warner ........................ 101/177 |

FOREIGN PATENT DOCUMENTS

| | | |
|---|---|---|
| JP | 08511993 | 12/1996 |
| JP | 2002-266292 | 9/2002 |
| JP | 2004-001520 | 1/2004 |
| JP | 2007-055257 | 3/2007 |
| JP | 2008-087209 | 4/2008 |
| JP | 2008-173587 | 7/2008 |
| JP | 2011-161319 | 8/2011 |
| JP | 2011-253784 | 12/2011 |
| KR | 10-2010-0137134 | 12/2010 |
| KR | 10-2011-0003444 | 1/2011 |
| KR | 10-2010-0016385 | 8/2011 |
| WO | 95/16073 | 6/1995 |
| WO | 2010-009853 | 1/2010 |

* cited by examiner

INTEGRATED COATING SYSTEM

CROSS-REFERENCE TO RELATED APPLICATION

This application claims priority to and the benefit of Korean Patent Application No. 10-2012-0103657 filed in the Korean Intellectual Physical property Office on Sep. 19, 2012, the entire contents of which are incorporated herein by reference.

BACKGROUND OF THE INVENTION (a) Field of the Invention

The present invention relates to an integrated coating system, and more particularly, to an integrated coating system capable of integrally coating and printing materials having various physical properties from low viscosity to ultra high viscosity by using integrated equipment.

(b) Description of the Related Art

A lithography technology has been widely used for an existing electronic element manufacturing technology. The lithography technology is a technology of forming an integrated circuit by directly drawing an extremely fine and complex electronic circuit on a semiconductor substrate, and the photolithography technology to which a photographic technology is applied has been first developed and used. The photo lithography technology employs a method in which a pattern of the IC carved in the mask is transferred in photo resist by irradiating ultraviolet rays to a substrate on which the photo resist is applied through a photo mask (original plate).

However, in constructing an actual process by using the photo lithography technology, there is a problem in that a process design and a device construction become complex because various and complex detailed processes, such as vacuum deposition, exposing, developing, plating, or etching, are necessary. Further, due to the development of a fine technology in various fields, a method of manufacturing an integrated circuit by another method other than the photo lithography method has been sought.

A printing electronic technology is a technology employing a method of manufacturing an electronic device by simply performing a printing process. Since the printing electronic technology fundamentally removes process complexity contained in the photo lithography process by substituting the aforementioned photo lithography process, an application range of the printing electronic technology has been recently expanded to various fields and in this respect, researches on the printing electronic technology have been actively conducted. As a recently utilized printing technology, a representative non-contact printing technology includes inkjet coating, spray coating, and slot-die coating, and a representative contact printing technology includes a gravure method, a gravure offset method, a reverse offset method, and a screen printing method. There are many various types of printing electronic technologies, which may be appropriately selected according to a characteristic, such as viscosity, of a material to be printed to be used. That is, there is a technology appropriate to be applied to a low viscosity material having low viscosity, and there is a technology appropriate to be applied to a high viscosity material having high viscosity. For example, it is known that a technology, such as slot-die coating, is appropriately applied to a high viscosity material, and a technology, such as gravure offset, is appropriately applied to a low viscosity material.

Recently, a case where a film type substrate formed of a flexible material, not a substrate formed of a solid material, is used in a semiconductor manufacturing technology has been increased. In a case of using the film type substrate, there is a merit in that a processing speed is increased, thereby achieving mass production. In this case, in view of a fact that production efficiency may be further improved when the aforementioned printing electronic technology is combined, researches on a combination of a roll-to-roll production method and the printing electronic technology have been very actively conducted.

As described above, it is well known that there are various types of materials for forming the integrated circuit, and more appropriate printing technologies to be applied are different according to the respective physical properties (viscosity and the like) of the materials.

In the past, since there are many cases where the materials for forming the integrated circuit is low priced, and the printing electronic technology is not various, an economical problem is not significantly generated in performing various tests. However, according to the development of the semiconductor manufacturing technology, a high-priced material is used often, the printing electronic technology becomes changes too much, and a price is also increased in proportion to performance of each printing electronic device itself, so that there is a problem in that costs are excessively increased for conducting various tests. In addition, in a state where an integrated circuit configuration technology itself is developed and, a multilayer configuration more complex than that of the related art is increased, there may incur a problem of an increase in inconvenience and a decrease in accuracy in a process of performing an operation while moving one substrate to various printing electronic devices.

Korean Patent Publication No. 2011-0003444 ("COLOR FILTER MANUFACTURED BY USING ROLL PRINTING METHOD", Jan. 12, 2011, Prior Document 1) discloses a technology of manufacturing a color filter by performing multiprinting by using a plurality of printing rolls and coaters, and Korean Patent Publication No. 2010-0016385 ("COMPLEX ROLL PRINTER", Aug. 31, 2011, Prior Document 2) discloses a technology relating to a complex roll printer selectively implementing roll-to-roll printing and roll-to-plate printing. As such, an effect to perform more various and complex work in the printing electronic technology with integrated equipment is made in the related art. However, in a case of Prior Document 1, a plurality of substantially same equipment is simply arranged, and in a case of Prior Document 2, a device for transferring a substrate to a printing device simply selectively replaces a film type substrate or a plate type substrate, but the printing device itself simply uses the same single printing technology.

Ink used for printing electron has various viscosity from a viscosity of 1 cP, which is watery like water to a viscosity of several hundreds of cP like screen paste. Further, the materials used for ink are very various, such as a metal material, such as silver, copper, and gold, an inorganic material, such as $SiO_2$, ZnO, $TiO_2$, and an organic material, such as $P_3HT$, PCBM, and PeDOT, a size of a particle of the material is various from several nanometers to several tens of micro, and a shape of the particle is very various, such as a globular shape, a flake shape, and a cylinder shape. The various ink needs to be cured after printing, and a curing characteristic is different according to a mix of respective materials, such as thermal curing, IR curing, and UV curing. Accordingly, it is essentially necessary to apply a printing technology appropriate to the ink and a technology of curing the ink.

A printing device in which the materials having the various physical properties (viscosity) may be freely used and various printing technology appropriate to the various physical properties may be easily changed and used has been steadily demanded, but there is presently no printing device satisfying the demand.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an integrated coating system capable of performing coating and printing with integrated equipment by selectively using a printing means in accordance with a physical property of respective materials for the materials having various physical properties from low viscosity to ultra high viscosity. An exemplary embodiment of the present invention provides an integrated coating system, including: a unwinding means provided with a roll formed by winding a web-shaped substrate to supply a web; a worktable roll configured to support the web supplied from the unwinding means; a plurality of printing means configured to perform printing or coating on the web supplied from the unwinding means, each printing means being modulated so that at least one of the printing means is selectively used; a plurality of curing means each of which is modulated so that at least one of the curing means is selectively used to cure a printing material on the web passing through at least one printing means by a method appropriate to a physical property of each material; and a winding means around which the web, of which printing or coating work is completed by passing through the curing means, is wound in a roll shape.

In this case, the printing means may be disposed so as to perform printing or coating on the web supported by the worktable roll or disposed on a horizontal movement path of the web passing through the worktable roll.

In this case, the plurality of printing means may be disposed so as to perform printing or coating on the web supported by the worktable roll, and may be radially disposed based on a center point of the worktable roll.

In this case, the printing means may be a first printing means provided under the worktable roll. In this case, the first printing means may use at least one method selected from low viscosity printing methods with a roll type, in which printing is available from a lower surface, such as a gravure method, a gravure offset method, a micro gravure method, a flexo method.

In the meantime, the printing means may be a second printing means provided at a side portion of the worktable roll. In this case, the second printing means may use at least one method selected from intermediate viscosity printing methods, in which printing is available in a side surface, such as, a slot die coating method, a comma coating method, and a bar coating method.

In the meantime, the printing means may be a third printing means provided above the worktable roll. In this case, the third printing means may use at least one method selected from high viscosity printing methods, in which printing is available in an upper surface, such as, a slit coating method, a slot die coating method, and a curtain coating method.

In this case, the printing means may be disposed on a horizontal movement path of the web passing through the worktable roll, and at least one of the printing means may be disposed in a row.

In this case, the printing means may be a fourth printing means disposed on the horizontal movement path of the web passing through the worktable roll. In this case, the fourth printing means may use at least one printing method selected from printing methods requiring a predetermined area or a mask for printing, such as a screen printer method and a spray coating method. When the screen printing is used, ultra high viscosity printing may be performed.

Further, the curing means may be disposed on a horizontal movement path of the web passing through the worktable roll. The curing means is positioned immediately after passing through the worktable roll in order to perform the curing immediately after the printing, in order to prevent a problem in that a shape of the pattern is deformed according to a hydrophilic/hydrophobic relation with the substrate when drying is late after the printing.

Further, the curing means may include at least one of an IR/UV irradiating unit, a direct heating unit, and a hot wind drying unit. In this case, the curing means may be configured so that at least one of the IR/UV irradiating unit, the direct heating unit, and the hot wind drying unit may be selectively operable.

Further, the plurality of curing means is disposed in parallel in order to adopt various process conditions for respective positions. For example, various temperature conditions may be set for the respective curing means, and various curing means may be used for respective curing devices.

Further, the integrated coating system may further include a tilting preventing means provided on a path of the web between the unwinding means and the worktable roll or a path of the web between the curing means and the winding means to detect and prevent tilting of the web.

Further, the integrated coating system may further include a tension adjusting means provided on a path of the web between the unwinding means and the worktable roll to adjust tension of the web.

Further, the integrated coating system may further include a surface processing means provided on a path of the web between the unwinding means and the worktable roll to perform surface processing on the web. In this case, the surface processing means may perform hydrophilic processing or hydrophobic processing.

Further, the integrated coating system may further include a contaminant removing means provided on a path of the web between the unwinding means and the worktable roll to remove contaminants on the web.

According to the exemplary embodiment of the present invention, it is possible to selectively use the printing means appropriate to a physical property of each material for materials having various physical properties from low viscosity to ultra high viscosity, thereby achieving a large effect of freely using more various materials.

The exemplary embodiment of the present invention discloses the integrated coating system in which the printing means are modulated and the modulated printing means are selectively usable. Accordingly, a price of each of coater or printer equipment is very high, so that there is an economical difficulty in installing new equipment in the related art, but in the exemplary embodiment of the present invention, materials with various physical properties are integrally usable by using only the integrated equipment, thereby achieving an effect of significantly improving economical efficiency in view of costs of equipment.

Further, according to the exemplary embodiment of the present invention, since the curing means are also modulated, as well as the printing means, it is possible to apply various printing technologies using various materials only with integrated equipment, so that it is not necessary to move a substrate to another device during the process, thereby achieving a large effect of significantly simplifying a process design compared to the related art.

DETAILED DESCRIPTION OF THE EMBODIMENTS

Hereinafter, an integrated coating system according to the present invention including the aforementioned configuration will be described in detail with reference to the accompanying drawings.

First, terms will be organized below. To describe strictly, a coater is a device for performing coating and a printer is a device for performing printing. "Coating" generally refers to a case where a uniform thin film is formed without forming a certain pattern, and "printing" generally refers to a case where a certain pattern is formed. However, there is a case where a coater may implement a simple pattern, and a printer may uniformly form a thin film without forming a pattern as a matter of course. Further, in general, in many cases, techniques used in a coater or a printer in a printing electronic technology are common or similar to each other. Considering this point, hereinafter, "printing" and "coating" are not strictly discriminated, and a device performing printing or coating will be collectively referred to as a "printing means".

Figure 1:
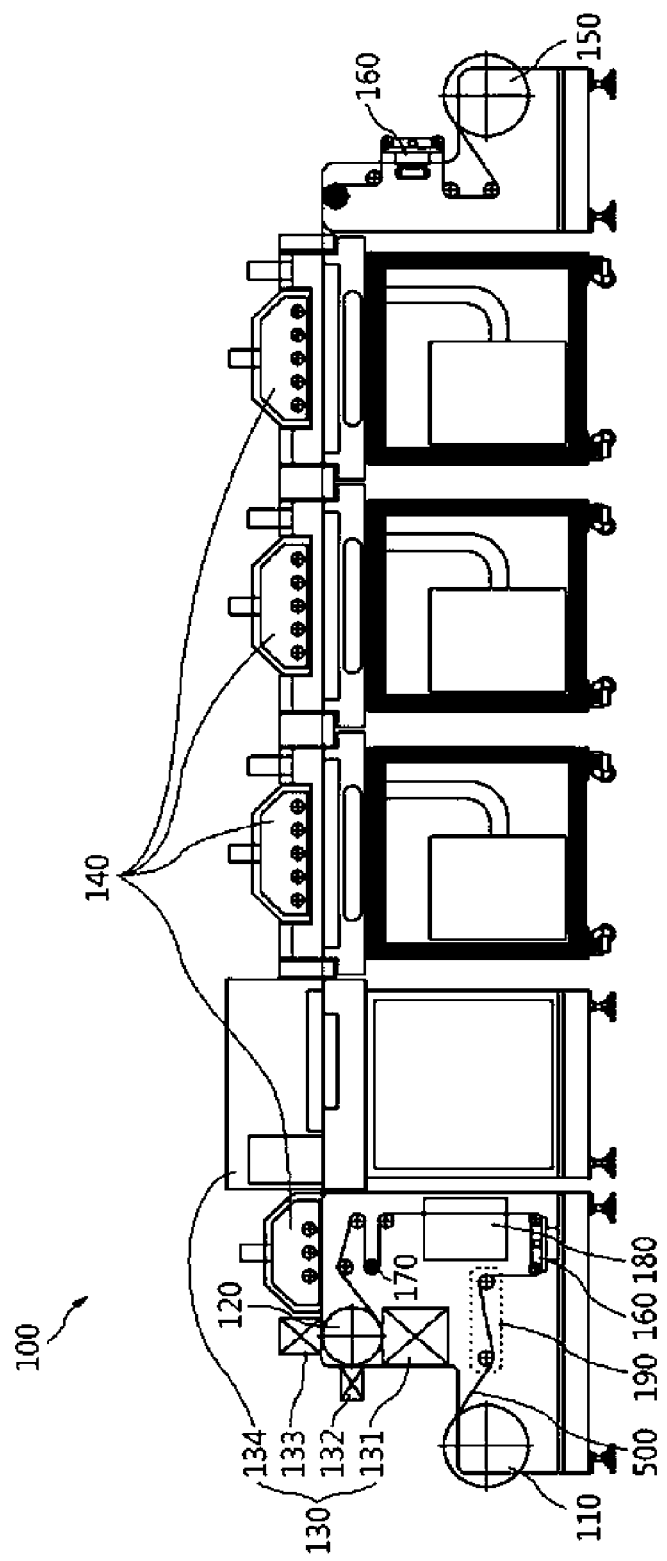
FIG. 1 is a configuration diagram of an integrated coating system according to an exemplary embodiment of the present invention.

FIG. 1 is a configuration diagram of an integrated costing system according to an exemplary embodiment of the present invention.

As illustrated in FIG. 1, the integrated coating system 100 according to the exemplary embodiment of the present invention may basically include a unwinding means 110, a worktable roll 120, a printing means 130, curing means 140, and a winding means 150.

In this case, in the integrated coating system 100 of the present invention, the printing means 130 and the curing means 140 are formed of a plurality of devices each of which is modulated, so that a type of printing technique desired to be applied may be variously, freely, and easily changed without moving a target object or further including another equipment.

As illustrated in FIG. 1, the unwinding means 110 is equipped with a roll formed by winding a substrate shaped like a web 500 to serve to supply the web 500. The integrated coating system 100 according to the exemplary embodiment of the present invention may be applied to a flexible substrate shaped like a film (this is generally referred to as a "web"), and a processing target substrate in the integrated coating system 100 according to the exemplary embodiment of the present invention may be the web 500.

The worktable roll 120 serves to support the web 500 supplied from the unwinding means 110. In addition to the worktable roll 120, as illustrated in FIG. 1, a plurality of rolls supporting the web 500 and guiding a path may be further included.

A plurality of printing means 130 is provided in the integrated coating system 100 according to the exemplary embodiment of the present invention. In this case, the printing means 130 performs printing or coating on the web 500 supplied from the unwinding means 110, and that each of the printing means 130 is modulated and provided so that at least one of the printing means 130 may be selectively used. The printing means 130 will be described in more detail later again.

The integrated coating system 100 according to the exemplary embodiment of the present invention is provided with a plurality of curing means 140. In this case, each of the curing means 140 is modulated and provided so that at least one of the curing means 140 may be selectively used so as to cure a printing material on the web 500 passing through at least one printing means 130 by a method appropriate to a physical property of each material. The curing means 140 will also be described in more detail later again.

The winding means 150 serves to wind the web 500, of which printing or coating work is completed after the web 500 passes through the curing means 140, in a roll type. That is, when the web 500 roll in an original state in which any process is not performed is held on the unwinding means 110, the web 500 passes through the worktable roll 120, the (plurality of) printing means 130, the (plurality of) curing means 140 so that the process is completed, and then the web 500 is wound by the winding means 150 to form the roll, thereby completing the process at once without moving the web 500 to another equipment.

As described above, the integrated coating system 100 according to the exemplary embodiment of the present invention may solve a problem in that costs for constructing equipment are excessively increased in a case where a process using various materials is desired to be performed because of an expensive price of each of a coater or a printer itself in the related art, and a problem in that a process design and operation become complex because a process target object needs to be moved to equipment for another process after one process is finished. In the exemplary embodiment of the present invention, the plurality of modulated printing means appropriate to materials having various physical properties (viscosity and the like) is provided, and the plurality of printing means 130 may be selectively used, thereby solving the aforementioned problems.

As illustrated in FIG. 1, the printing means 130 may be disposed so as to perform printing or coating on the web 500 supported by the worktable roll 120, or may be disposed on a horizontal movement path of the web 500 passing through the worktable roll 120.

An exemplary embodiment in which the printing means 130 are disposed so as to perform printing or coating on the web 500 supported by the worktable roll 120 will be described in more detail later.

Figure 2:
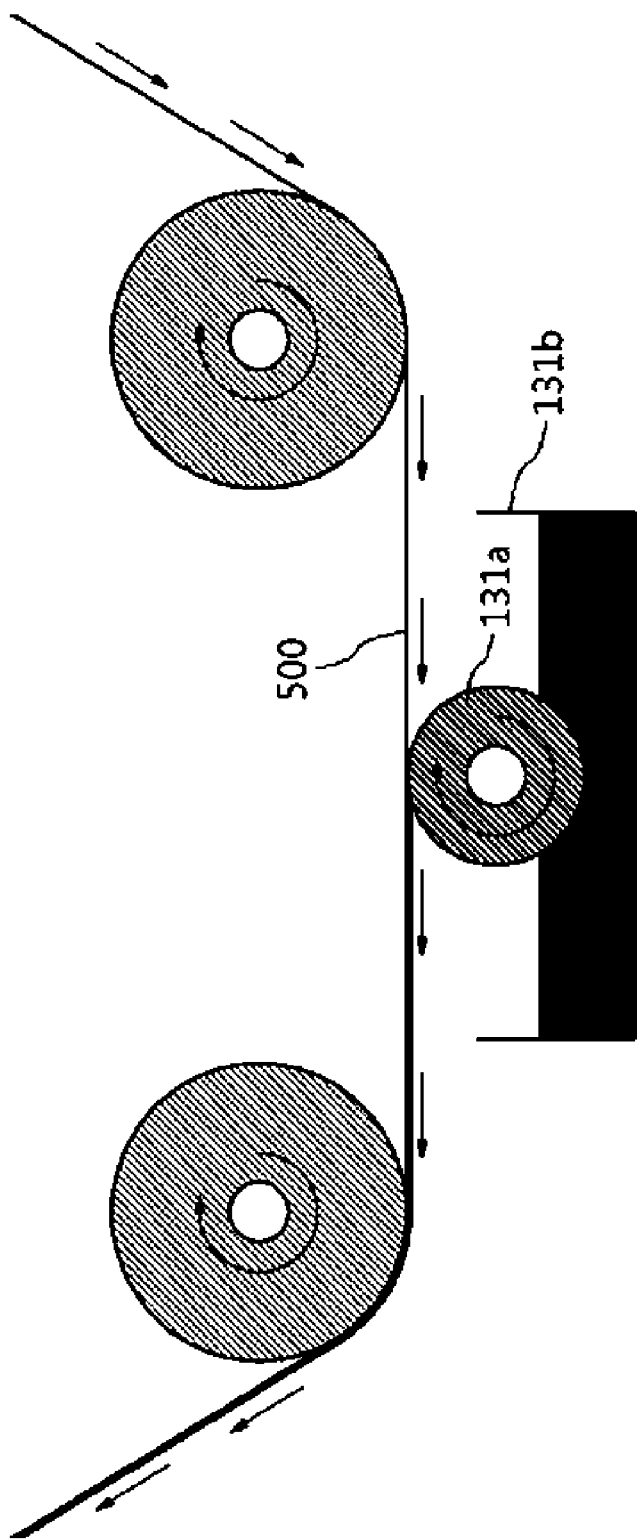
FIG. 2 is an example of a printing means of the integrated coating system according to the exemplary embodiment of the present invention.
Figure 3:
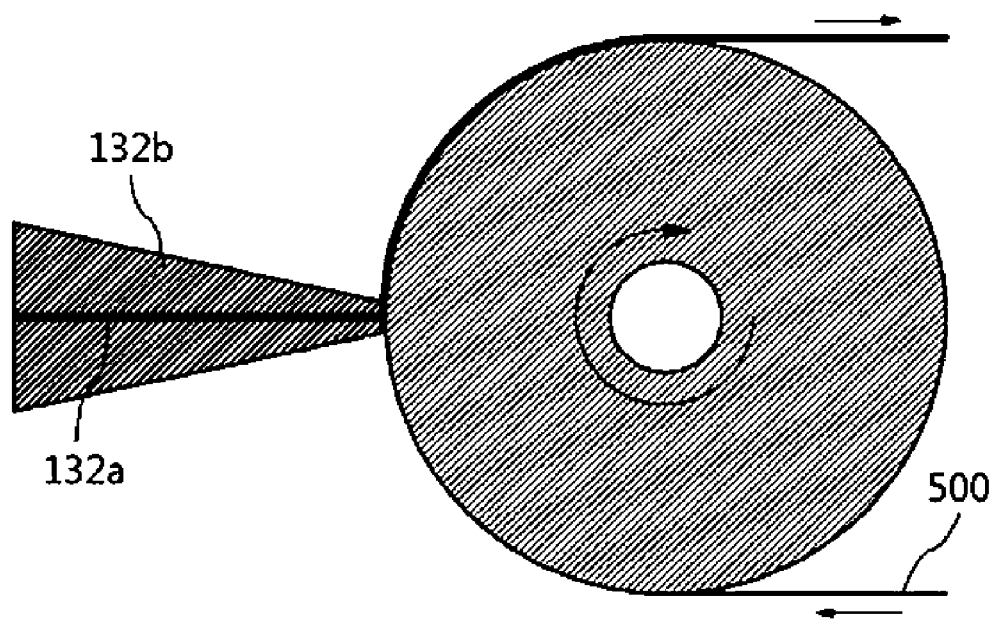
FIG. 3 is another example of the printing means of the integrated coating system according to the exemplary embodiment of the present invention.
Figure 4:
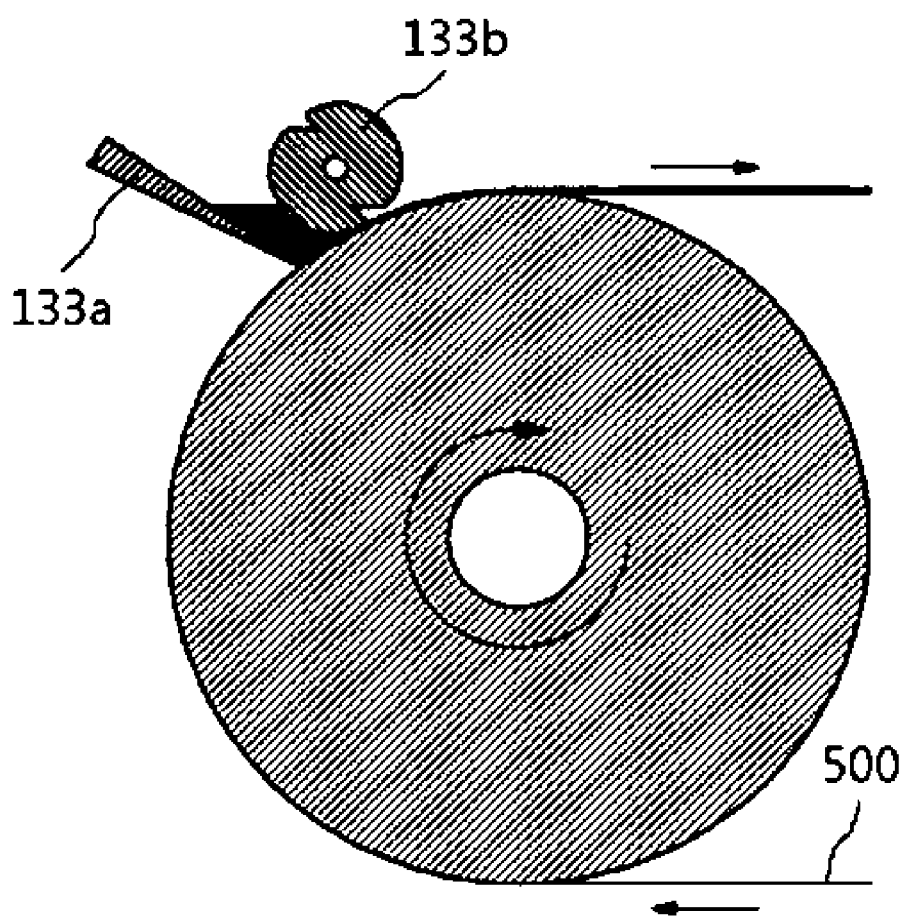
FIG. 4 is yet another example of the printing means of the integrated coating system according to the exemplary embodiment of the present invention.

According to exemplary embodiment of the present invention, a plurality of printing means 130 may be radially disposed based on a center point of the worktable roll 120. FIGS. 2 to 4 illustrate various exemplary embodiments of the printing means 130 applicable to a case where the plurality of printing means 130 is radially disposed based on the center point of the worktable roll 120.

As one example of the exemplary embodiments, the printing means 130 may be a first printing means 131 provided at a lower portion of the worktable roll 120.

In this case, the first printing means 131 may use a low viscosity printing method with a roll type capable of performing printing in a lower surface, such as a gravure method, a gravure offset method, a micro gravure method, and a flexo method.

The aforementioned several methods, which are methods constructed so that a material is disposed under a movement path of the web to perform printing or coating, are appropriate to be applied to a low viscosity material having low viscosity (for example, approximately $10^2$ to $10^3$ cps) in view of a physical property of a material. It is highly probable that the low viscosity material flows down, so that a method of coating the material at the lower portion may be most appropriate.

FIG. 2 illustrates a principle of a micro gravure coating method, which is one method applicable to the first printing means 131. (In FIG. 2, a left roll between two rolls at an upper side corresponds to the worktable roll 120 of the present invention.)

In this case, as illustrated in FIG. 2, a roll 131a and a reservoir 131b in which a material is accommodated are provided under the path through which the web 500 progresses.

In this case, an upper portion of the roll 131a is in contact with a lower surface of the web 500, and a lower portion of the roll 131a is in contact with the material inside the reservoir 131b.

Accordingly, the material coated on a surface of the roll 131a is moved to and coated on the web 500 according to a rotation of the roll 131a, so that the material is coated on the web 500.

Further, the roll 131a rotates in an opposite direction to a movement direction of the web 500, so that the material coated on the lower surface of the web 500 is further well spread, thereby achieving a uniform thickness of the coated material.

For another example of the printing means 130, the printing means 130 may be a second printing means 132 provided in a side portion of the worktable roll 120.

In this case, the second printing means 132 may use an intermediate viscosity printing method capable of performing printing at a side surface, such as a slot die coating method, a comma coating method, and a bar coating method.

The aforementioned several methods are methods in which a material is disposed in a side portion of the movement path of the web to perform printing or coating, and are applicable to an intermediate viscosity material having intermediate viscosity (for example, $10^4$ cps) in view of a physical property of the material. It is not highly possible that the intermediate viscosity material flows down, so that a method of coating the material in the side portion as described above is applicable. (Since the method is applicable to a low viscosity material or a high viscosity material, so that materials with more various viscosity may be applied according to a necessity as a matter of course.)

FIG. 3 illustrates a principle of the slot die coating method, which is one method applicable to the second printing means 132. (In FIG. 3, the roll supporting the web 500 corresponds to the workable roll 120 in the exemplary embodiment of the present invention.)

In this case, as illustrated in FIG. 3, a die 132b (corresponding to the worktable roll 120 of the present invention) provided with a slot 132a is in close contact with a side surface of the roll supporting the web 500 at a fine interval.

In this case, when a material is supplied through the slot 132a, the material is discharged through a gap between the die 132b and the web 500 and then is coated on the web 500 to perform the coating.

As yet another example of the printing means 130, the printing means 130 may be a third printing means 133 provided on an upper portion of the worktable roll 120.

In this case, the third printing means 133 may use a high viscosity printing method capable of performing printing on an upper surface, such as a slit coating method, a slot die coating method, and a curtain coating method.

The aforementioned several methods are methods, in which a material is disposed in an upper portion of the movement path of the web to perform printing or coating, and are appropriate to be applied to a high viscosity material having high viscosity (for example, approximately $10^5$ to $10^6$ cps) in view of a physical property of the material.

FIG. 4 illustrates a principle of the comma coating method which is yet another method applicable to the third printing method 133. (In FIG. 4, the roll supporting the web 500 corresponds to the worktable roll 120 in the exemplary embodiment of the present invention.)

In this case, as illustrated, a blade 133a is in close contact with one side of the roll supporting the web 500, and a thickness adjusting means 133b is in close contact with the roll at a rear end thereof at a fine interval, so that a space between the blade 133a and the thickness adjusting means 133b is filled with the material. Accordingly, the material is discharged through a gap between the thickness adjusting means 133b and the web 500 and then is coated on the web 500, to perform coating.

The exemplary embodiment in which the printing means 130 is disposed on the horizontal movement path of the web 500 passing through the worktable roll 120 will be descried in more detail below. In this case, when the number of printing means 130 is plural, the printing means 130 may be disposed in a row.

As an example of the exemplary embodiment, the printing means 130 may be a fourth printing means 134 disposed on a horizontal movement path of the web 500 passing through the worktable roll 120.

In this case, the fourth printing means 134 may use a printing method requiring a predetermined area or a mask for printing, such as a screen printer method and a spray coating method.

The aforementioned several methods are methods in which a material is disposed on the horizontal movement path of the web to perform printing or coating, and are appropriate to be applied to, especially, an ultra high viscosity material having very high viscosity (for example, approximately $10^6$ to cps), for example, in a case where the screen printer method is used in view of a physical property of the material.

The descriptions of the several exemplary embodiments of the printing means 130 will be synthesized. The printing means 130 are provided at various positions, such as on the worktable roll 120 or on the horizontal movement path of the web 500, to be modulated and provided in a form appropriate to be applied to each position.

Further, a shape of the printing means 130 is closely associated with the physical property (viscosity and the like) of the material, and to synthesize the aforementioned descriptions, the printing means 130 may use a material having sequentially increasing viscosity according to a sequential disposition position of a case where the printing means 130 is disposed under the worktable roll 120, a case where the printing means 130 is disposed at the side portion of the worktable roll 120, a case where the printing means 130 is disposed above the worktable roll 120, or a case where the printing means 130 is disposed on the horizontal movement path of the web 500 passing through the worktable roll 120.

More specifically, a low viscosity material may be used in the printing means 130 disposed under the worktable roll 120, an intermediate viscosity material may be used in the printing means 130 disposed at a side portion of the worktable roll 120, a high viscosity material may be used in the printing means 130 disposed above the worktable roll 120, and an ultra high viscosity material may be used in the printing means 130 disposed on the horizontal movement path of the web 500 passing through the worktable roll 120. FIG. 1 illustrates an arrangement form of the printing means modules according to the exemplary embodiment.

As described above, the integrated coating system 100 according to the exemplary embodiment of the present invention is configured so that, as described above, the plurality or several types of printing means 130 are disposed on the worktable roll 120 and the horizontal path after passing through the worktable roll 120.

In this case, the printing means 130 may be selectively used, and for example, even in a case where the aforementioned first printing means 131, second printing means 132, third printing means 133, and fourth printing means 134 are all included, only the first printing means 131 may be used, or various combinations in which the first printing means 131 and the fourth printing means 134 may be used and the like are available.

In this case, the materials appropriate to be applied are also changed according to the disposed positions of the respective printing means 130. That is, in the aforementioned exemplary embodiment, a single layer may be formed with only a low viscosity material, and a multilayer may be formed with a low viscosity material and an ultra high viscosity material.

As described above, the exemplary embodiment of the present invention employs the configuration in which the plurality of modulated printing means 130 appropriate according to the materials having various physical properties (viscosity and the like) is provided and the printing means 130 may be selectively used.

In this case, appropriate curing methods according to each material may not be the same. A certain material may have a physical property which is cured when infrared rays (IR) or ultraviolet rays (UV) are irradiated, and a certain material may have a physical property cured by heat. According to the various curing characteristics, in the exemplary embodiment of the present invention, a plurality of curing means 140 may be provided so as to be appropriate to the curing characteristics.

Each of the curing means 140 may be modulated and provided so that at least one of the curing means 140 may be selectively used so as to cure the printing material on the web 500 passing through at least one printing means 130 by a method appropriate to a physical property of each material.

At least one of the printing means 130 is disposed on the worktable roll 120, so that the curing means 140 may be disposed on the horizontal movement path of the web 500 passing through the worktable roll 120.

In this case, for example, there may be a case where the printing material needs to be directly cured immediately after passing through the printing means 130 (that is, immediately after printing or coating is performed) according to the characteristic of the material, and there may be a case where there is no significant problem in even when the printing materials are cured at once after passing through the several printing means 130 in a case where the multilayer is formed of materials which have high viscosity and are not well mixed with each other. The curing methods may be different according to the physical property (curing characteristic) of each material for each case as a matter of course.

In the integrated coating system 100 according to the exemplary embodiment of the present invention, the curing means 140 may also be freely changed by modulating various curing devices so that the curing means 140 are disposed at desired positions or curing is performed at a desired time.

In the example illustrated in FIG. 1, one curing means 140 is disposed between the worktable roll 120 and the fourth printing means 134 and three curing means 140 are disposed at a rear end of the fourth printing means 134.

That is, a process may be designed so that the materials on the web 500 passing through the first, second, and third printing means 131, 132, and 133 are first cured, and the material on the web 500 passing through the fourth printing means 134 is cured by using the three curing means 140 at the rear end of the fourth printing means 134.

The example of FIG. 1 is merely one example, and the present invention is not limited thereto as a matter of course, and various modifications, for example, the curing means 140 may not be disposed or the more number of curing means 140 may not be disposed between the worktable roll 120 and the fourth printing means 134, and the desired number of curing means, such as one, two, or four curing means 140, not the three curing means 140, may be disposed at the rear end of the fourth printing means 134, may be carried as a matter of course.

Figure 5:
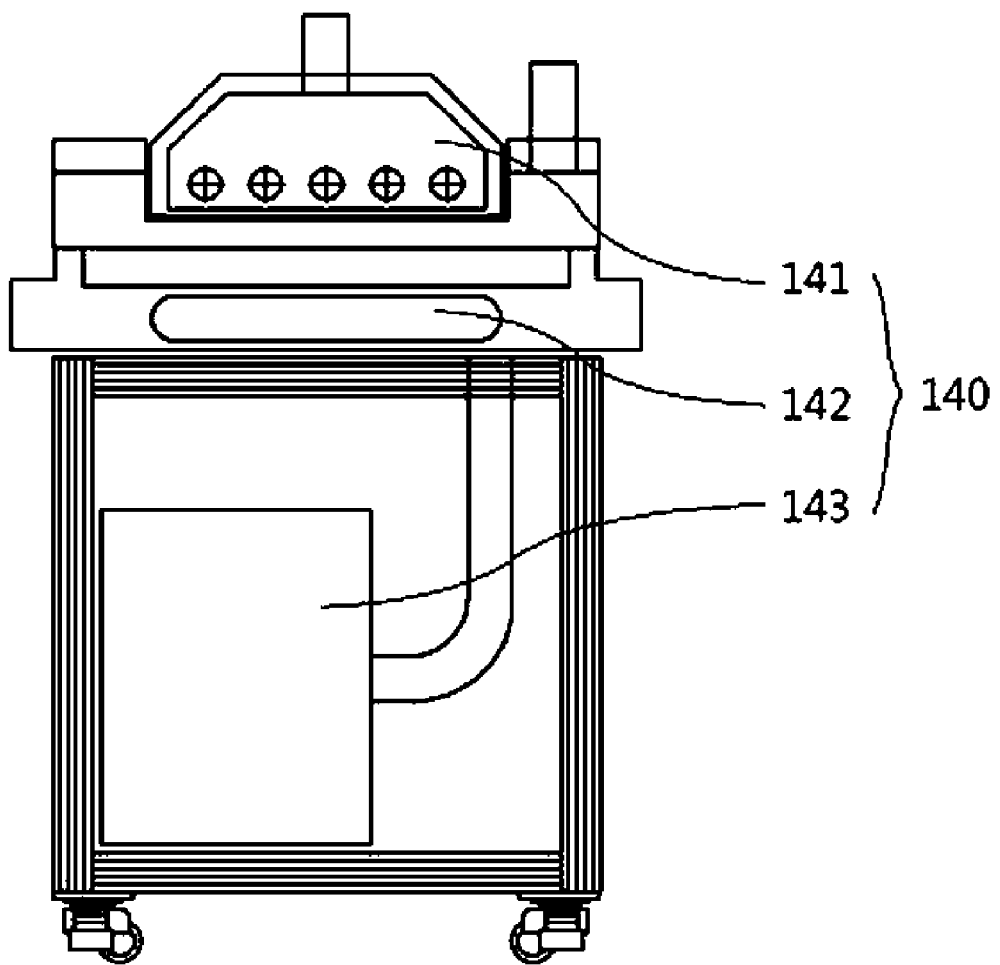
FIG. 5 is an example of a curing means of the integrated coating system according to the exemplary embodiment of the present invention.

FIG. 5 illustrates an exemplary embodiment of the curing means. As illustrated in FIG. 5, the curing means 140 may include at least one of an IR/UV irradiating unit 141, a direct heating unit 142, and a hot wind drying unit 143.

According to a property of the material (curing characteristic), the material may be cured when ultraviolet rays are irradiated, may be cured when strong heat is applied, and may be cured even when weak heat is applied although heating is necessary, so that an appropriate curing method is changed.

In this case, according to the exemplary embodiment of the present invention, as illustrated in FIG. 5, the curing means 140 includes at least one of the IR/UV irradiating unit 141, the direct heating unit 142, and the hot wind drying unit 143, so that the aforementioned curing methods may be applied.

In this case, as illustrated in the example of the curing means 140 disposed between the worktable roll 120 and the fourth printing means 134 of FIG. 1, the curing means 140 may include only the IR/UV irradiating unit 141 and may include one or two of the aforementioned several devices.

In the aforementioned case, a volume of the curing means 140 itself is decreased, so that compact equipment may be configured by decreasing a volume of entire equipment.

Otherwise, as illustrated in FIG. 5, the curing means 140 includes all of the IR/UV irradiating unit 141, the direct heating unit 142, and the hot wind drying unit 143 and at least one of the IR/UV irradiating unit 141, the direct heating unit 142, and the hot wind drying unit 143 may be selectively operated.

In this case, similar to the example of the three curing means 140 disposed in parallel at the rear end of the fourth printing means 134 of FIG. 1, the plurality of curing means 140 is disposed, in such a way that each curing means 140 may select a necessary function to be operated. For example, 1) the IR/UV irradiation unit 141 irradiates UV in the first curing means 140, the direct heating unit 142 heats the material at a temperature of T1 in the second curing means 140, and the direct heating unit 142 heats the material at a temperature of T2 in the third curing means 140, or ii) the hot wind drying unit 143 heats the material at a temperature of T3 in the first curing means 140 and the IR/UV irradiation unit 141 irradiates IR in the second curing means 140, so that various curing work with various combination and under various conditions may be freely and easily changed to be performed.

As described above, the integrated coating system 100 according to the exemplary embodiment of the present invention may freely select and use various materials with single equipment.

In the related art, there is a problem in that various coaters or printers need to be separately provided in order to use various materials, but in the exemplary embodiments of the present invention, the appropriate printing means 130 for each material are modulated to be all provided, so that a process may be performed without limitation of viscosity of the material in any degree.

In addition, a problem of the difference of the curing method according to the material may be easily overcome by selectively using the curing means 140 modulated so as to selectively use various curing methods in the exemplary embodiments of the present invention.

The merit also contains a merit that the process by the integrated coating system 100 according to the exemplary embodiment of the present invention is far simpler than that of the related art.

That is, in the related art, there is a problem in that when a process is finished in one coater during the performance of the process with various coaters or printers, the substrate needs to be moved to another coater, so that complexity and inconvenience are great in designing a process and operating the process. However, in the present invention, the process itself may be almost performed in a one-stop manner, so that the aforementioned problems may be fundamentally solved. This will be described in more detail.

In the integrated coating system 100 according to the exemplary embodiment of the present invention, a form and a disposition position of the printing means 130 are designed based on a viscosity characteristic of a material, so that a one-stop process is available in a case where a multilayer formed of materials in an order of low viscosity-intermediate viscosity-high viscosity-ultra high viscosity is desired to be formed.

For another example, when a multilayer formed of materials in an order of high viscosity-low viscosity-intermediate viscosity is desired to be formed, even though the process may not be finished at once due to the disposition of the printing means 130, it is enough to perform the process only with two steps in an order of forming a layer formed of a [high viscosity] material—and forming a layer formed of [low viscosity-intermediate viscosity] materials.

During the process, while the web 500 is mounted on the unwinding means 110 in a roll form, the process starts, and the web 500 is wound around the winding means 150 in the roll form so that the process is completed. Accordingly, when the roll wound around the winding means 150 is mounted on the unwinding means 110 as it is, a process of a directly subsequent step may be performed without a necessity of separate preparation work.

In the related art, since all of the respective coaters or printers do not have the same standard or form, preparation work for uniformly adjusting a process condition to the condition of the previous process is essentially necessary when a subsequent process is performed (by changing equipment) after one process is completed. However, in the exemplary embodiment of the present invention, the process is performed with single equipment, so that the preparation work (for adjusting a process condition to a peripheral condition according to a change in equipment) is not necessary at all.

Accordingly, according to the exemplary embodiment of the present invention, a work time is greatly decreased during the operation of the process, thereby ultimately considerably improving work convenience and production efficiency.

Further, the integrated coating system 100 according to the exemplary embodiment of the present invention may further include devices to be described below for more smoothly and efficiently performing the process.

First, the integrated coating system 100 may further include a tilting preventing means 160 provided on the path of the web 500 between the unwinding means 110 and the worktable roll 120 or the path of the web 500 between the curing means 140 and the winding means 150 to detect and prevent tilting of the web 500.

The tilting preventing means 160 may be an edge position controller (EPC) generally used for detecting left and right positions of a film or fabric and preventing tilting distortion.

In general, the roll-to-roll process is continuously performed, but in the integrated coating system 100 according to the exemplary embodiment of the present invention, even though the process is the roll-to-roll process, the process is not certainly continuously performed.

For example, in a case where the fourth printing means 134 in FIG. 1 is a screen printer, the movement of the web 500 is irregularly and discontinuously performed according to an operation characteristic of the screen printer. However, the web 500 is irregularly and discontinuously moved, there is a high possibility in that left and right distortion (tilting) is generated. In this case, the tilting preventing means 160 is provided at a rear end of the unwinding means 110 or a front end of the winding means 150, so that it is possible to prevent tilting of the web 500, thereby achieving an effect of more smoothly progressing the process and preventing a damage of the web 500 or degradation of a quality of a print output.

Second, the integrated coating system 100 may further include a tension adjusting means 170 provided on the path of the web 500 between the unwinding means 110 and the worktable roll 120 to adjust tension of the web 500. The tension adjusting means 170 is also widely used in a roll moving device of a film or fabric, so that the tension adjusting means 170 may be configured by employing an appropriate device.

Third, the integrated coating system 100 may further include a surface processing means 180 provided on the path of the web 500 between the unwinding means 110 and the worktable roll 120 to perform surface processing on the web 500. In this case, the surface processing means 180 may perform hydrophilic processing or hydrophobic processing.

Fourth, the integrated coating system 100 may further include a contaminant removing means 190 provided on the path of the web 500 between the unwinding means 110 and the worktable roll 120 to remove contaminants on the web 500. In FIG. 1, the contaminant removing means 190 is simply illustrated in a roll form, and in a case of the form, the contaminant removing means 190 may be configured so that contaminants, such as dust, are smeared on the roll by using the roll wound with a material having weak adhesive force, thereby removing the contaminants on the web 500.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of symbols> | |
|---|---|
| 100: Integrated coating system | 110: Unwinding means |
| 120: Worktable roll | 130: Printing means |
| 131: First printing means | 132: Second printing means |
| 133: Third printing means | 134: Fourth printing means |
| 140: Curing means | 141: IR/UV irradiating unit |
| 142: Direct heating unit | 143: Hot wind drying unit |
| 150: Winding means | 160: Tilting preventing means |
| 170: Tension adjusting means | 180: Surface processing means |
| 190: Contaminant removing means | |
| 500: Web | |

What is claimed is:

1. An integrated coating system, comprising:
a unwinding means provided with a roll formed by winding a web-shaped substrate to supply a web;
a worktable roll configured to support the web supplied from the unwinding means;
a plurality of printing means configured to perform printing or coating on the web supplied from the unwinding means, each printing means being modulated so that at least one of the printing means is selectively used;
a plurality of curing means each of which is modulated so that at least one of the curing means is selectively used to cure a printing material on the web passing through at least one printing means and appropriate to a physical property of each material; and
a winding means around which the web, of which printing or coating work is completed by passing through the curing means, is wound in a roll shape
wherein the plurality of printing means are disposed so as to perform printing or coating on the web supported by the worktable roll, and are radially disposed based on a center point of the worktable roll, and
wherein the plurality of the curing means are disposed on a horizontal movement path of the web passing through the worktable roll, and a first curing means is disposed between the worktable roll and a last printing means, and another curing means is disposed at a rear end of the last printing means.

2. The integrated coating system of claim 1, wherein:
the printing means are disposed on a horizontal movement path of the web passing through the worktable roll.

3. The integrated coating system of claim 1, wherein:
the printing means is a first printing means provided under the worktable roll.

4. The integrated coating system of claim 3, wherein:
the first printing means uses at least one selected from a gravure, a gravure offset, a micro gravure, a flexo.

5. The integrated coating system of claim 1, wherein:
the printing means is a second printing means provided at a side portion of the worktable roll.

6. The integrated coating system of claim 5, wherein:
the second printing means uses at least one selected from a slot die coating, a comma coating, and a bar coating.

7. The integrated coating system of claim 1, wherein:
the printing means is a third printing means provided above the worktable roll.

8. The integrated coating system of claim 7, wherein:
the third printing means uses at least one selected from a slit coating, a slot die coating, and a curtain coating.

9. The integrated coating system of claim 2, wherein:
the printing means are disposed on a horizontal movement path of the web passing through the worktable roll, and at least one of the printing means is disposed in a row.

10. The integrated coating system of claim 9, wherein:
the printing means is a fourth printing means disposed on the horizontal movement path of the web passing through the worktable roll.

11. The integrated coating system of claim 10, wherein:
the fourth printing means uses at least one selected from between a screen printer and a spray coating.

12. The integrated coating system of claim 1, wherein:
the curing means includes at least one of an IR/UV irradiating unit, a direct heating unit, and a hot wind drying unit.

13. The integrated coating system of claim 12, wherein:
the curing means is configured so that at least one of the IR/UV irradiating unit, the direct heating unit, and the hot wind drying unit is selectively operable.

14. The integrated coating system of claim 1, further comprising:
a tilting preventing means provided on a path of the web between the unwinding means and the worktable roll or a path of the web between the curing means and the winding means to detect and prevent tilting of the web.

15. The integrated coating system of claim 1, further comprising:
a tension adjusting means provided on a path of the web between the unwinding means and the worktable roll to adjust tension of the web.

16. The integrated coating system of claim 1, further comprising:
a surface processing means provided on a path of the web between the unwinding means and the worktable roll to perform surface processing on the web.

17. The integrated coating system of claim 16, wherein:
the surface processing means performs hydrophilic processing or hydrophobic processing.

18. The integrated coating system of claim 1, further comprising:
a contaminant removing means provided on a path of the web between the unwinding means and the worktable roll to remove contaminants on the web.

* * * * *